(12) United States Patent
Valk

(10) Patent No.: US 11,043,928 B2
(45) Date of Patent: Jun. 22, 2021

(54) RF POWER AMPLIFIER SYSTEM

(71) Applicant: Ampleon Netherlands B.V., Nijmegen (NL)

(72) Inventor: Patrick Valk, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 38 days.

(21) Appl. No.: 16/632,259

(22) PCT Filed: Jul. 17, 2018

(86) PCT No.: PCT/NL2018/050494
§ 371 (c)(1),
(2) Date: Jan. 17, 2020

(87) PCT Pub. No.: WO2019/017779
PCT Pub. Date: Jan. 24, 2019

(65) Prior Publication Data
US 2020/0169235 A1 May 28, 2020

(30) Foreign Application Priority Data
Jul. 18, 2017 (NL) .................................. 2019267

(51) Int. Cl.
*H03G 3/30* (2006.01)
*H03F 3/24* (2006.01)

(52) U.S. Cl.
CPC .......... *H03G 3/3042* (2013.01); *H03F 3/245* (2013.01); *H03F 2200/451* (2013.01); *H03G 2201/103* (2013.01); *H03G 2201/307* (2013.01)

(58) Field of Classification Search
CPC .................................................... H03G 3/304
See application file for complete search history.

(56) References Cited

U.S. PATENT DOCUMENTS 5,504,457 A * 4/1996 Jensen ................ H03G 1/04
330/129
6,606,483 B1 * 8/2003 Baker .................. H03F 1/0277
455/126

(Continued)

FOREIGN PATENT DOCUMENTS

JP  2002-185263 A  6/2002
JP  2003-133969 A  5/2003

OTHER PUBLICATIONS

International Searching Authority; International Search Report (ISR) for PCT/NL2018/050494 dated Feb. 5, 2019; 5 pages.

(Continued)

*Primary Examiner* — Patricia T Nguyen
(74) *Attorney, Agent, or Firm* — McDonnell Boehnen Hulbert & Berghoff LLP

(57) ABSTRACT

At least one embodiment relates to a radio-frequency (RF) power amplifier system for amplifying a first RF signal. The RF power amplifier system includes a RF power amplifier being configured to amplify a second RF signal. The RF power amplifier system also includes a control loop for controlling a power level of the second RF signal. The control loop includes a RF output power determining unit for determining a power level of the amplified second RF signal. The control loop also includes a gain determining unit for determining an actual large signal gain based on the determined power level of the amplified second RF signal and a power level of the second RF signal. Further, the control loop includes an attenuator for attenuating the first RF signal and for providing the attenuated first RF signal to the RF power amplifier as the second RF signal.

15 Claims, 4 Drawing Sheets

(56) References Cited

U.S. PATENT DOCUMENTS

| | | | |
|---|---|---|---|
| 8,670,729 B2* | 3/2014 | Behzad | H04W 52/52 455/115.1 |
| 2009/0021300 A1 | 1/2009 | Romano | |
| 2010/0321086 A1* | 12/2010 | See | H04B 1/0458 327/359 |
| 2012/0321104 A1* | 12/2012 | Kemmerer | H03G 3/3021 381/107 |
| 2018/0014121 A1* | 1/2018 | Lawrence | G10L 21/0272 |

OTHER PUBLICATIONS

International Searching Authority; Written Opinion for PCT/NL2018/050494 dated Feb. 5, 2019; 10 pages.

\* cited by examiner

RF POWER AMPLIFIER SYSTEM

CROSS-REFERENCE TO RELATED APPLICATION

The present application is a national stage entry of PCT/NL2018/050494 filed Jul. 17, 2018, which claims priority to NL 2019267 filed on Jul. 18, 2017, the contents of each of which are hereby incorporated by reference.

The present invention relates to a radio-frequency (RF) power amplifier system for amplifying an RF signal. The present invention further relates to a telecommunications base station and a solid state cooking apparatus comprising such an RF power amplifier system and to a method for amplifying an RF signal.

RF power amplifiers systems are known in the art. These systems comprise an RF power amplifier being configured to amplify an RF signal. This amplifier is typically packaged and comprises an active die having an RF power transistor arranged thereon. Additionally, impedance matching circuits may be included inside the package.

An RF power amplifier can be characterized using several performance parameters. Important parameters are the maximum output power and the power added efficiency at a given output power. The power added efficiency can be defined as (Prf,out-Prf,in)/Pdc, where Prf,out is the level of RF output power, Prf,in the level of RF input power, and Pdc the supplied level of DC power. The level of RF output power depends on the impedance matching between the load and the RF power amplifier. To obtain high efficiency values, it is important that the load presented to the RF power amplifier approaches the ideal load for a given power level.

In some applications, the impedance presented to the RF power amplifier and to the RF power transistor in particular is relatively constant. However, for solid state cooking this does not hold. Due to the large variety of foodstuffs to be heated, as well as the transformation of these foodstuffs during cooking, the RF power transistor may be presented with large mismatches. When operating at relatively high powers, a large mismatch may result in permanent damage to the RF power transistor or to other components in the RF power amplifier system.

Permanent damage of the RF power transistor can be avoided by operating the RF power amplifier at strong back off, but this seriously hampers good efficiency values to be achieved. Another known solution is to implement an isolator at the output of the RF power transistor. An isolator allows the power wave reflected back from the cooking cavity to be dissipated instead of allowing the reflected wave to reach the RF power amplifier. Isolators are however costly components and significantly increase the footprint of the total solution.

It is therefore a goal of the present invention to provide an RF power amplifier system that is able to operate at relatively high output powers while reducing the risk of permanent damage to the components of the RF power amplifier system.

According to the invention, this goal is achieved using an RF power amplifier system for amplifying a first RF signal as defined in claim 1, which comprises an RF power amplifier being configured to amplify a second RF signal and a control loop for controlling a power level of the second RF signal. According to the invention, this control loop comprises an RF output power determining unit for determining a power level of the amplified second RF signal, a gain determining unit for determining an actual large signal gain in dependence of the determined power level of the amplified second RF signal and a power level of the second RF signal. The control loop also comprises an attenuator for attenuating the first RF signal in dependence of a difference between the determined actual large signal gain and a desired large signal gain and for providing the attenuated first RF signal to the RF power amplifier as the second RF signal.

According to the present invention, the output power of the RF power amplifier is changed in dependence of a difference between an actual large signal gain and a desired large signal gain.

The gain determining unit may be further configured for determining a desired large signal gain in dependence of a power level of the second RF signal. In an embodiment, the gain determining unit may use a correlation table, stored in a memory, having a correlation between the power level of the second RF signal and the desired large signal gain. Alternatively, the desired large signal gain is computed using a mathematical equation. To this end, the RF power amplifier system may comprise a processing unit for performing the calculation. This processing unit may be incorporated in the gain determining unit.

The attenuator may be configured to increase an attenuation of the attenuator when the actual large signal gain is smaller than the desired large signal gain minus a first threshold. Hence, when a large mismatch occurs that limits the large signal gain, the output power of the RF power amplifier is lowered. The first threshold may be set to zero. Positive non-zero values for the first threshold may be used to prevent altering the attenuation when the difference between the actual large signal gain and the desired large signal gain is only moderate. Similarly, the attenuator may be configured to decrease an attenuation of the attenuator when the actual large signal gain is larger than the desired large signal gain plus a second threshold. Here, the second threshold may be set to zero or to a positive non-zero value. Again, using a positive non-zero value for the second threshold prevents altering the attenuation when the difference between the actual large signal gain and the desired large signal gain is only moderate.

The power level of the second RF signal can be determined using an RF input power determining unit. Such unit may for instance be configured to determine the power level based on the attenuation of the attenuator and the power level of the first RF signal. Alternatively, the RF input power determining unit may comprise a sensor for determining the power level of the second RF signal. Examples of such sensors are a directional coupler combined with a pin-diode, or other means for measuring voltage and/or current. Additionally, a look-up table may be used that lists the power level as a function of the measured current and/or voltage. Such power determination is possible clue to the fact that the input impedance seen looking into the RF power amplifier does not strongly depend on the impedance mismatch at the output.

The RF output power determining unit may comprise a detecting system for detecting a DC power supplied to the RF power amplifier and for estimating a power dissipated by the RF power amplifier. The RF output power determining unit may further comprise a power estimating unit for estimating the power level of the amplified second RF signal in dependence of the detected DC power and the estimated dissipated power. As the energy balance should be maintained, it can be stated that the sum of DC power and RF power that is supplied to the RF power amplifier should equal the outputted RF power and the dissipated power at least when averaged over a few cycli of the inputted RF signal. When the gain of the RF power amplifier is sufficiently large, the RF input power can be neglected. However, when the gain is or can be low, it is preferable if the power estimating unit is configured for estimating the power level of the amplified second RF signal in dependence of the detected DC power, the estimated dissipated power, and a power level of the second RF signal as described above.

To determine the DC power supplied to the RF power amplifier, the detecting system may be provided with a DC current detector for detecting a DC current supplied to the RF power amplifier and with a DC power determining unit for determining the DC power in dependence of the detected DC current and a supply voltage applied to the RF power amplifier.

To estimate the dissipated power, the detecting system may be provided with a thermal unit for determining a temperature of the RF power amplifier, and with a dissipated power estimating unit for estimating the dissipated power in dependence of the determined temperature of the RF power amplifier.

The applicant has found that by monitoring the initial fast increase of the temperature of the semiconductor die, a sufficiently accurate estimation of the dissipated power can be provided. More in particular, the dissipated power estimating unit can be configured to estimate the dissipated power in dependence of a current determined temperature of the RF power amplifier, one or more previously determined temperatures of the RF power amplifier, and/or time-derivative(s) of the determined temperature.

The thermal unit may comprise a temperature-sensitive component having voltage-current characteristics that are temperature dependent. For example, the RF power amplifier may comprise an RF power transistor arranged on a semiconductor die, and the temperature-sensitive component may be arranged on the semiconductor die. The temperature-sensitive component may comprise a diode or a transistor. Such known semiconductor components can be arranged on the semiconductor die close to the RF power transistor. Alternatively, the I-V characteristics of a part of the RF power transistor itself are monitored for determining a semiconductor die temperature.

The RF power amplifier may comprise a packaged RF power transistor, wherein the packaged RF power transistor comprises a package provided with a flange, wherein the RF power transistor is mounted on the flange inside said package. During operation, the temperature of the flange will vary on a much larger timescale than the temperature of the semiconductor die. A sudden increase in dissipated power will therefore result in a very rapid initial increase of the temperature of the semiconductor die and to a subsequent much slower increase of the temperature of the semiconductor die, which is related to the slower heating of the flange.

The thermal unit may further be configured to determine the temperature of the flange. Alternatively, the RF power amplifier system may comprise a further thermal unit for determining the temperature of the flange. The dissipated power estimating unit may be configured to estimate the dissipated power in dependence of the determined flange temperature. For example, when the flange is at a relatively high temperature, for instance due to heating up as a result of the dissipated power in the RF power amplifier or due to environmental conditions, the behaviour of the temperature of the semiconductor die in time may be different than at lower temperatures of the flange. In an embodiment, the dissipated power estimating unit comprises a calibration that correlates a flange temperature and/or a semiconductor die temperature and/or time derivatives thereof to a dissipated power.

The skilled person will understand that the flange temperature depends on the position on the flange where the temperature is measured. The same holds for the semiconductor die temperature. However, because the relation between a locally determined temperature and the relevant temperature, e.g. the average temperature or the temperature at a given semiconductor junction, is generally fixed, the locally determined temperature has found to provide sufficiently accurate results.

It may be possible to use a calibration step prior to determining the dissipated RF power. Such calibration step may comprise determining the semiconductor die temperature in the absence of dissipated RF power. In this case, it is assumed that the temperature of the flange can be determined using the temperature of the semiconductor die after a predetermined amount of time and/or using the time-derivative(s) of the semiconductor die.

As an alternative to estimating the dissipated power using thermal measurements, the RF power amplifier system may further comprise a directional coupler having an input port coupled to an output of the RF power amplifier, a transmitted port coupled to the load, a coupled port and an isolated port. It may then be advantageous if the RF power amplifier further comprises an isolator arranged between the transmitted port and the load, and a first power sensor for measuring a power level at the coupled port. By using an isolator, no power will be reflected back towards the RF power amplifier. Consequently, the power outputted by the RF power amplifier can be determined using a single power sensor that is configured for measuring the power level at the coupled port.

Alternatively, two power sensors can be used for measuring the power level at the coupled port and the isolated port. In that case, the power of the amplified second signal can be determined using a difference between the power at the coupled port and the isolated port.

The attenuator may be realized using known components such as resistors.

The present invention also provides a telecommunications base station or a solid state cooking apparatus comprising the RF power amplifier system as defined above.

According to a further aspect, the invention also relates to a method for amplifying a first RF signal using the RF power amplifier system having the thermal unit as described above. This method comprises the steps of:
a) performing a calibration step in the absence of the second RF signal and substantial DC power being supplied to the RF power amplifier, the calibration step comprising determining a flange temperature;
b) applying the second RF signal and DC power to the RF power amplifier to amplify the second RF signal;
c) estimating the power dissipated by the RF power amplifier in dependence of the determined flange temperature, a current determined temperature of the RF power amplifier, and one or more previously determined temperatures of the RF power amplifier and/or time-derivative(s) of the determined temperature;
d) determining the DC power supplied to the RF power amplifier;
e) estimating the power level of the amplified second RF signal in dependence of the detected DC power and the estimated dissipated power;

f) determining an actual large signal gain of the RF power amplifier in dependence of the estimated power level of the amplified second RF signal and a power level of the second RF signal;

g) comparing the determined large signal gain to a desired large signal gain; and h) controlling the attenuator in dependence of said comparison.

Next, the invention will be described in more detail referring to the appended drawings, wherein.

Figure 1:
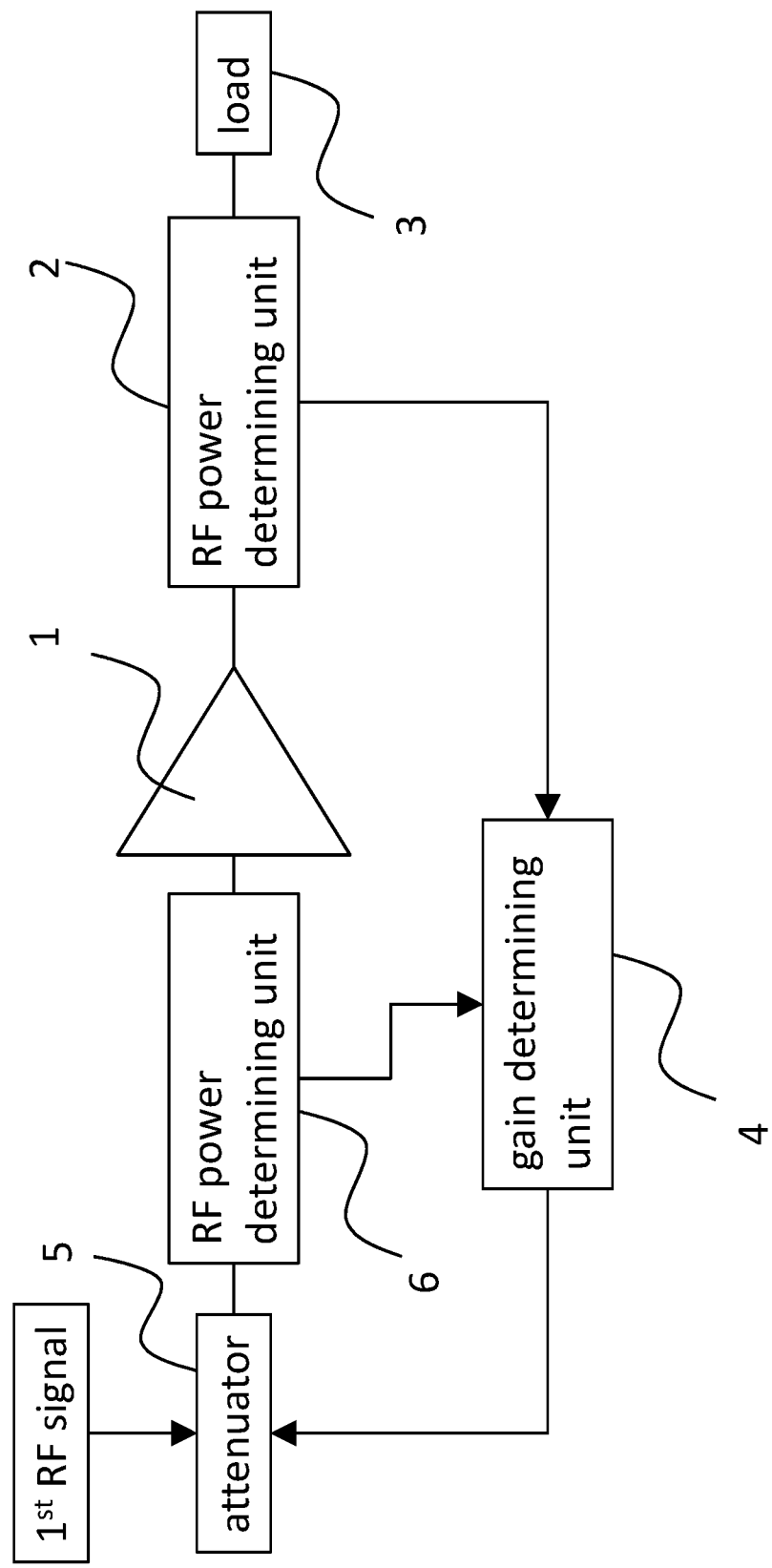
FIG. 1 illustrates an embodiment of an RF power amplifier system in accordance with the present invention.

FIG. 1 illustrates an embodiment of an RF power amplifier system in accordance with the present invention. It comprises an amplifier 1 having its output coupled to an RF power determining unit 2. Amplifier 1 is configured to output the amplified RF signal to a load 3. A RF power determining unit 2 is configured to determine or estimate the power level of the amplified second RF signal that is fed to load 3.

FIG. 1 shows load 3 being connected to RF power determining unit 2 suggesting that the amplified RF signal passes through the RF power determining unit 2. As an example, the RF power determining unit 2 may comprise a directional coupler having the transmitted port thereof connected to load 3. Alternatively, the amplified RF signal may be separated into a small part that is fed to the RF power determining unit 2 and a substantially larger part that is fed directly to load 3. FIG. 1 relates to both cases and the connection between RF power determining unit 2 and amplifier 1 merely indicates that power outputted by amplifier 1 is measured or analysed by RF power determining unit 2. A similar consideration holds for the connection of RF power determining unit 6 to be discussed later.

The signal to be amplified by amplifier 1 is provided as the first RF signal. This signal is fed to an attenuator 5. The attenuated signal is fed to the input of the amplifier 1 as the second RF signal. A RF power determining unit 6 is configured to determine or estimate the power level of the second RF signal that is fed to amplifier 1.

The attenuation introduced by attenuator 5 is determined based on a difference between the actual large signal gain of amplifier 1 and a desired large signal gain of amplifier 1. Both the desired gain and the actual gain can be determined by gain determining unit 4. This unit receives an estimation of the power level of the amplifier second RF signal from RF power determining unit 2, and an estimation of the power level of the second RF signal from RF power determining unit 6.

Gain determining unit 4 may he configured to determine the desired large signal gain only based on the power level of the second RF signal. Alternatively, this information is fed to the gain determining unit 4. It may also be possible that this information is derived from the power level of the first RF signal and the attenuation of attenuator 5.

According to the invention, when it is determined that amplifier 1 has a large signal gain that deviates too much from the desired gain, the attenuation of attenuator 5 is increased to reduce the power outputted by amplifier 1. For example, reducing the output power may result in decreased voltage levels inside amplifier 1 or in decreased dissipated power. The same may hold for other components connected to the output of amplifier 1 such as matching networks or isolators. In general, reducing the outputted power reduces the risk of the system getting permanently damaged.

Gain determining unit 4 compares an actual large signal gain to a desired large signal gain and controls attenuator 5 in accordance with this comparison. Suitable thresholds may be defined to regulate the controlling behaviour of gain determining unit 4. For example, gain determining unit 4 may be configured to only change the attenuation of attenuator 5 when the actual large signal gain is lower than the desired large signal gain minus a first threshold or when the actual large signal gain is higher than the desired large signal plus a second threshold.

Amplifier 1 generally comprises a packaged RF power amplifier. The packaged RF power amplifier comprises a package in which an active semiconductor die is arranged on a flange. On the semiconductor die, an RF power transistor, such as a laterally diffused metal-oxide-semiconductor (LDMOS) transistor or a high electron mobility transistor (HEMT), is arranged. The semiconductor die may comprise a Silicon or Gallium Nitride die.

Inside the same package, impedance matching networks may be arranged for providing an impedance match between the output of the RF power transistor and load 3 or between the input of the RF power transistor and the source of the first RF signal or the output of attenuator 5. Generally, these impedance matching networks perform a partial match, wherein the remaining impedance matching is performed outside of the package. It may even be possible that all of the impedance matching is performed outside of the package.

The invention is not limited to a particular arrangement of the RF power determining unit 2. For example, the RF power determining unit 2 may be arranged at least partially inside the package. RF power determining unit 2 may be part of the impedance matching network between the RF power amplifier transistor and load 3. Alternatively, impedance matching networks may be arranged in between the RF power determining unit 2 and load 3 and/or in between RF power determining unit 2 and the RF power transistor. The same considerations hold for RF power determining unit 6.

Attenuator 5 may be arranged inside the package. It may be part of an input matching network or it may be arranged in front of or behind an input impedance network. Attenuator 5 may also be arranged outside the package, for example in the source of the first RF signal.

Generally, gain determining unit 4 is configured to perform a calculation to determine the actual large signal gain and/or the desired large signal gain. This can be achieved by means of suitable analogue circuitry arranged inside the package, for example using an integrated circuit on the active semiconductor die.

For most applications, the first RF signal is supplied by a driver (not shown). Typically, the driver outputs the first RF signal at a known power level. Other functionality may be provided on this driver such as pre-distortion or linearization. The gain determining unit 4 may be at least partially arranged inside the driver. For example, gain determining unit 4 may be configured to determine the desired large signal gain based on the known or derivable power level of the first RF signal that is outputted by the driver and the attenuation of attenuator 5. It may also be configured to receive the required parameters to determine the actual large signal gain as will be described later. These parameters may be obtained using dedicated sensors or circuitry arranged in various positions inside the system depending on the parameter and the manner in which this parameter is determined. The driver may also include attenuator 5 such that the attenuated signal is outputted to the amplifier 1 and/or to an input impedance network.

Attenuator 5 may comprise known components for attenuating an RF signal, such as a resistor. Alternatively, attenuator 5 can be realized using a variable gain amplifier in the driver. In this case, the driver itself outputs the attenuated first RF signal as the second RF signal.

Figure 2:
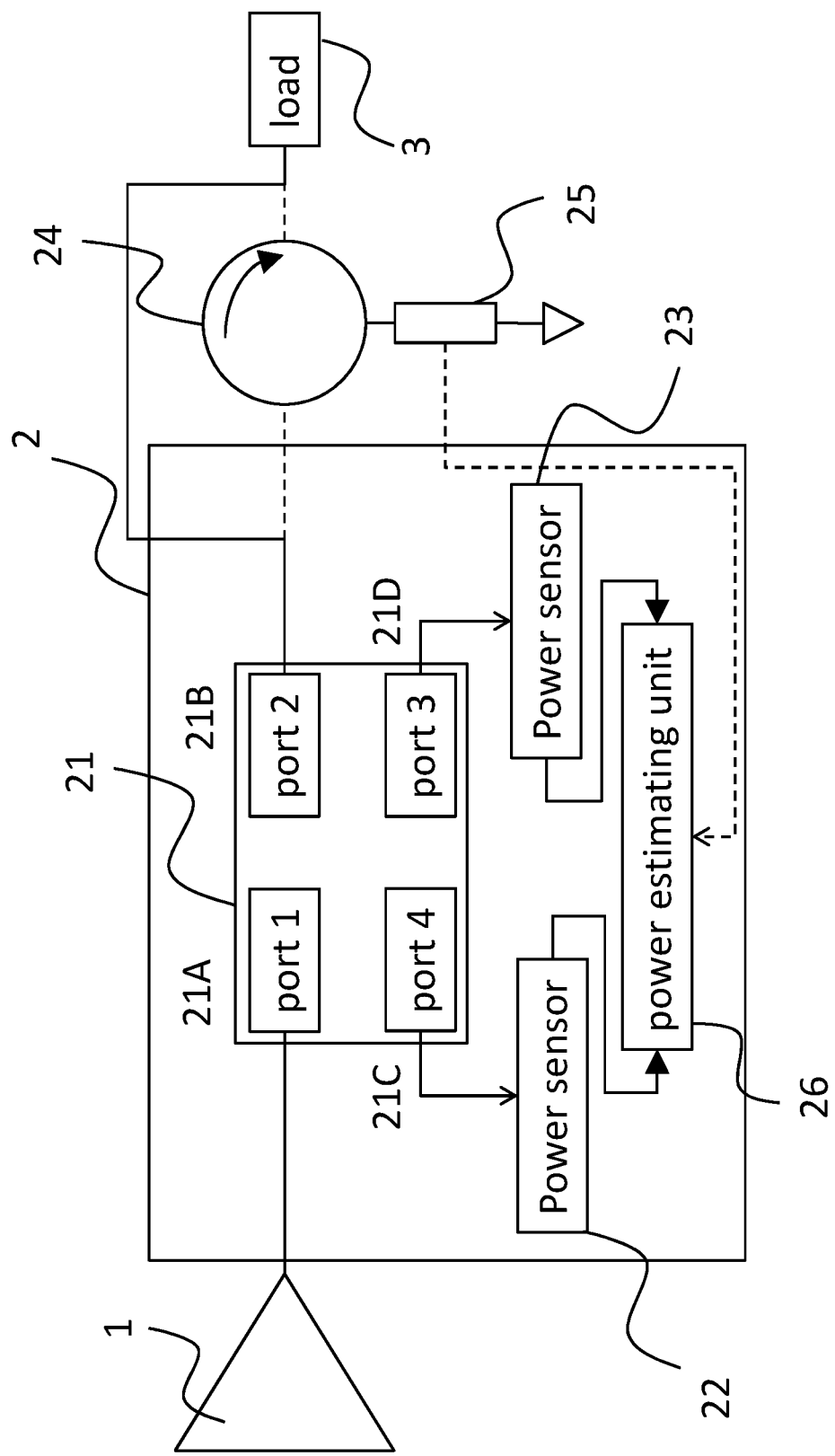
FIG. 2 illustrates an embodiment of an RF power determining unit according to the invention.

FIG. 2 illustrates an embodiment of RF power determining unit 2 according to the invention. It comprises a directional coupler 21 having an input port 21A, a transmitted port 21B, a coupled port 21C, and a isolated port 21D. Such directional couplers, also known as bi-directional couplers, are known in the art.

Input port 21A is connected to the output of amplifier 1, optionally via an impedance matching network. Transmitted port 21B is connected to load 3, optionally via an impedance matching network. Ports 21C and 21D are connected to respective power sensors 22, 23 for sensing the power that emerges at those ports. Power sensors are matched to the respective ports such that little to no power is reflected back into these ports. Port 21A is preferably impedance matched such that the inclusion of the directional coupler does not introduce undesired reflections of RF signal back into the amplifier. The same holds for port 21B which is preferably impedance matched to the ideal load or to the impedance matching network. Instead of being connected to load 3 directly (solid line), directional coupler 21 may be connected to load 3 via an isolator 24 (dashed line). Isolator 24 prevents signals from being reflected back towards directional coupler 21 but dissipates these signals in a load 25.

Power sensor 22 is configured to determine the power transmitted into directional coupler 21, i.e. the so called forward power, whereas power sensor 23 is configured to determine the power transmitted from load 3 back into directional coupler 21, i.e. the so called reflected power. This latter reflection may be due to a mismatch between the impedance of load 3 and the target impedance. RF power determining unit 2 can calculate the RF power outputted by amplifier 1 as the forward power minus the reflected power. This calculation is performed by a power estimating unit 26.

The RF power by RF power determining unit 2 is supplied to gain determining unit 4. This unit calculates the actual large signal gain as the ratio of the RF power outputted by amplifier 1 and the RF power inputted into amplifier 1. To determine the power inputted into amplifier 1 suitable sensors such as a pin-diode, a thermal sensor, a voltage and/or current sensor, or a look-up table, may be used. Here, it is noted that in general, the change in input impedance of the RF power transistor as a function of impedance mismatch at the load is significantly less than the change in output impedance of the RF power transistor. Consequently, there is a stronger correlation between voltage peaks at the input of amplifier 1 and the inputted power than there is at the output of amplifier 1. This allows relatively straightforward techniques to be used for determining the input power, such as peak voltage detection.

The inputted power can also be determined if the power level of the first RF signal is known in combination with the attenuation of attenuator 5.

Gain determining unit 4 may use the power level of the RF signal inputted into amplifier 1, referred to as the second RF signal, and the estimated power level of the RF signal outputted by amplifier 1, referred to as the amplified second RF signal, to determine the actual large signal gain. Gain determining unit 4 may also determine a desired large signal gain based on the power level of the first RF signal or the power level of the second RF signal.

FIG. 2 illustrates an isolator 24 in the form of a circulator that is optionally connected to directional coupler 21. Power that is reflected back to amplifier 1 due to an impedance mismatch at the load is dissipated in a load 25 that is connected to the circulator or is arranged therein. When isolator 24 is connected, little to no power will be reflected back into port 21B. Moreover, the impedance seen by amplifier 1 looking towards load 3 will not or not much depend on the impedance mismatch at the load and should ideally correspond to the optimal impedance. Consequently, the determined large signal gain will in most cases correspond to the desired large signal gain. However, when subjected to large impedance mismatches, isolator 24 or load 25 may get permanently damaged although the large signal gain of amplifier 1 is equal to the desired large signal gain.

To address this issue, it may be possible to determine the power dissipated in load 25. This load is generally purely resistive allowing the power dissipated in load 25 to be computed using conventional techniques as a peak voltage detector. This power can be combined with the power measured by sensor 22 to determine the large signal gain. More in particular, the power measured by sensor 22 can be used to determine the forward power whereas the power dissipated in load 25 can be used to determine the reflected power. Computing the large signal gain in this manner substantially equals determining the large signal gain of the combination of amplifier 1 and isolator 24. This gain can equally be compared to a desired gain. If the actual gain is much less than the desired gain, the output power of amplifier 1 can be reduced by lowering the power level of the inputted second RF signal. This will result in a reduction in power dissipated in load 25 and will reduce the risk of permanently damaging isolator 24 or load 25.

Figure 3:
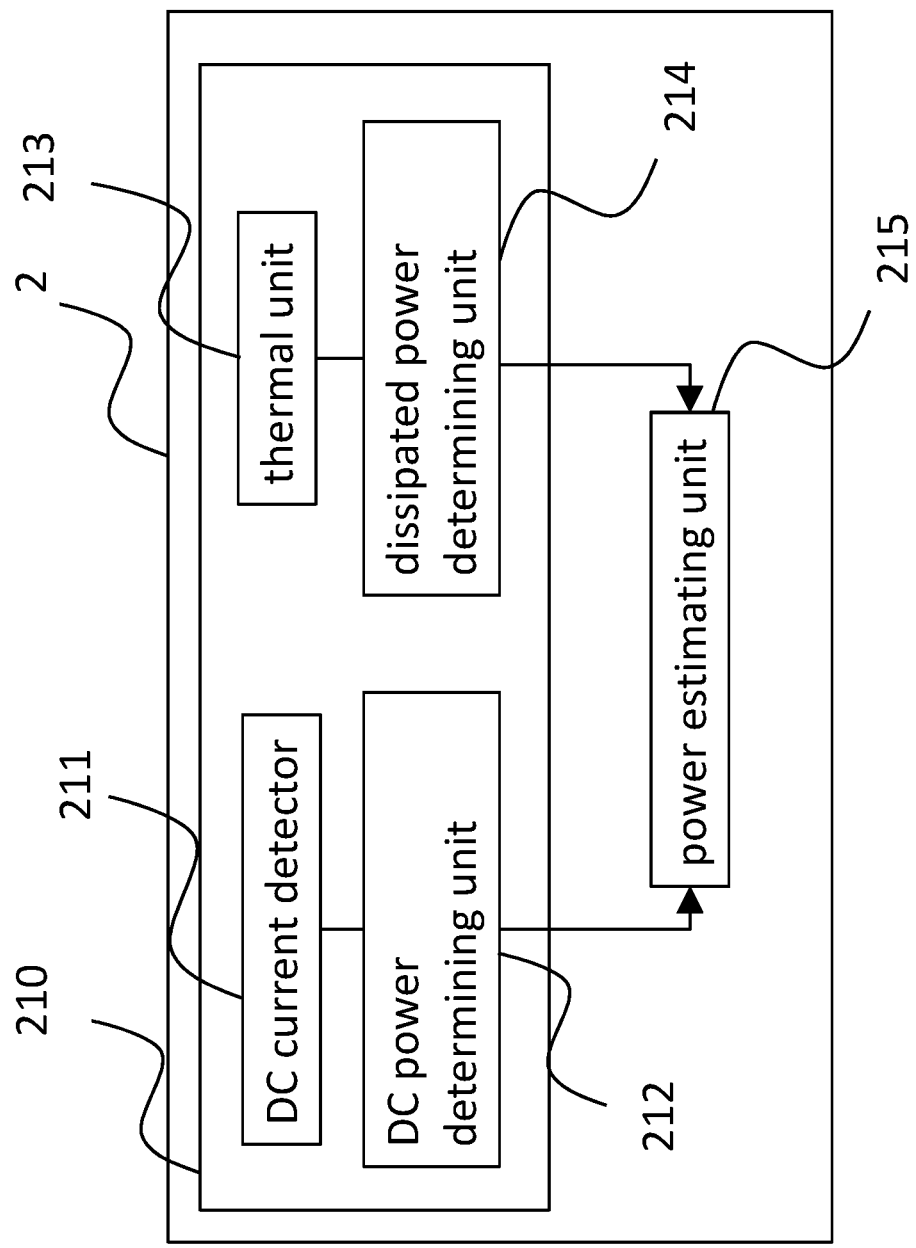
FIG. 3 illustrates a different embodiment of an RF power determining unit according to the invention.

FIG. 3 illustrates a different embodiment of RF power determining unit 2. This unit comprises a detecting system 210 for detecting a DC power supplied to amplifier 1 and for detecting a power dissipated by amplifier 1. To this end, detecting system 210 comprises a DC current detector 211 and a DC power determining unit 212. DC current detector 211 measures the DC current that is supplied to amplifier 1. Such current detectors 211 are known in the art and require no further elaboration. DC power determining 212 determines the DC power supplied to amplifier 1 by multiplying the measured current and the supply voltage of amplifier 1. To measure the supply voltage a voltage detector may be used.

To estimate the power dissipated by amplifier 1, a thermal unit 213 may be provided. This unit may comprise a temperature-sensitive component. Examples of such components are temperature sensors or electrical components having temperature dependent current-voltage characteristics. For example, the thermal unit 213 could comprise a diode arranged on the active die placed in close proximity to the RF power transistor. Alternatively, part of the RF power transistor itself could be used as thermal unit. For example, a small segment of the RF power transistor could be connected to a fixed impedance, such as a resistive load. By inspecting the current through this load as a function of the relevant voltage, e.g. the gate-source bias and/or the source-drain bias, in the absence of RF signals, the temperature of the relevant semiconductor junction can be determined. This temperature is representative for the temperature of the active die.

Detecting system 210 further comprises a dissipated power estimating unit 214 for estimating the power dissipated by power amplifier 1 based on the temperature determined by thermal unit 213. Compared to RF power determining unit 2 illustrated in FIG. 2, RF power determining unit 2 illustrated in FIG. 3 determines the outputted RF power indirectly. Instead of measuring power, the energy balance of amplifier 1 is used. More in particular, the outputted RF power is determined by power estimating unit 215 as the power that remains after subtracting the dissipated power from the sum of the supplied DC power and the inputted RF power. As stated earlier, the supplied RF power can be determined or measured using known techniques. However, for most applications the actual large signal gain is high enough such that the inputted RF power can be neglected compared to the supplied DC power.

The dissipated power is estimated in dependence of the determined temperature. More in particular, the dissipated power is determined using a currently determined temperature, one or more previously determined temperatures and/or and time-derivatives thereof.

In an embodiment, amplifier 1 comprises an active die on which an RF power transistor is arranged. This active die is mounted to a heat-conducting flange. The heat capacitance and coefficient of heat conduction of the flange are much larger than those of the active die. The combination of the flange and the active die will result in a thermal behaviour that is illustrated in FIG. 4.

Figure 4:
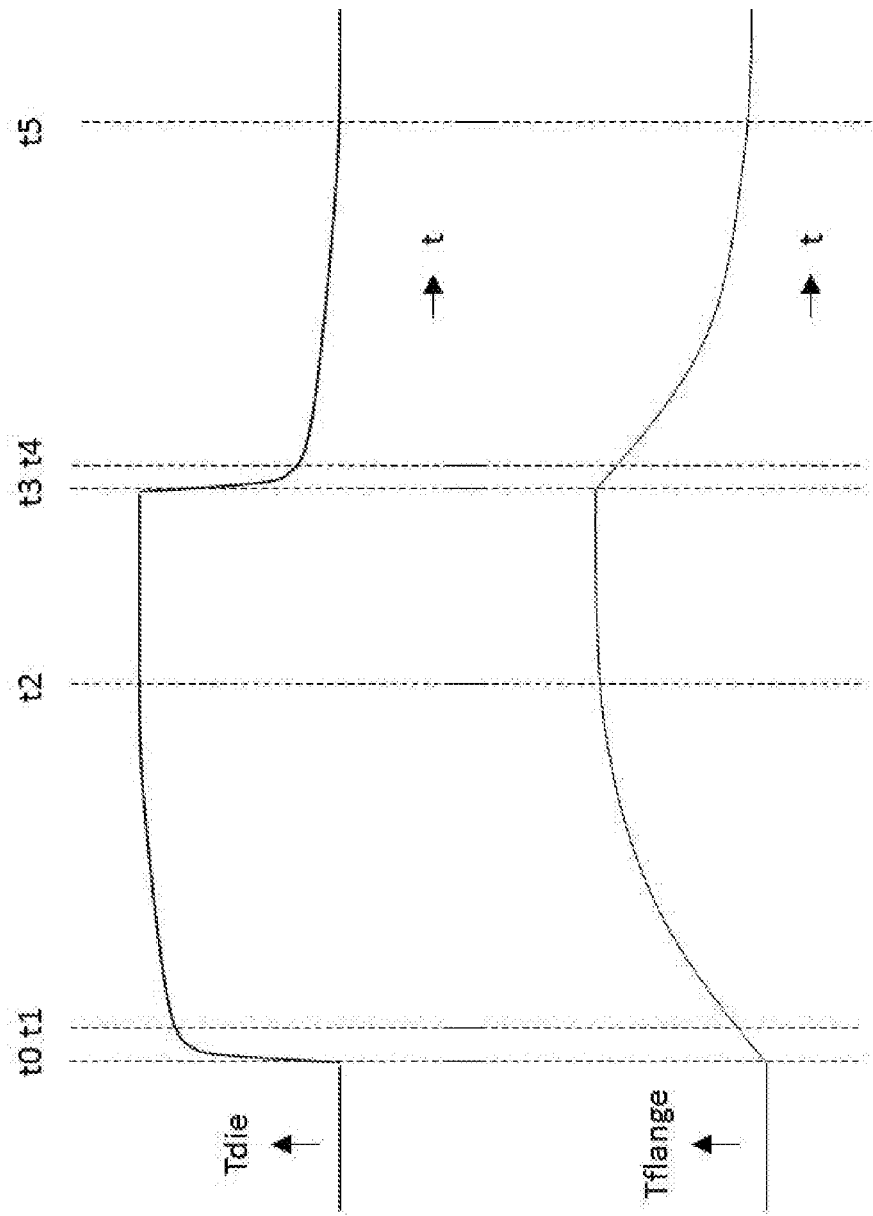
FIG. 4 illustrates the change in temperature of the active die and the change in temperature of the flange, in response to a sudden increase and decrease in dissipated power.

FIG. 4 illustrates the change in temperature of the active die (Tdie) and the change in temperature of the flange (Tflange), in response to a sudden increase in dissipated power at t=t0 and to a sudden decrease in dissipated power at t=t3. The increase may be due to a sudden impedance change at the load or to a switching on of the amplifier system, whereas the decrease may be due to a sudden change of the impedance match at the load.

As illustrated in FIG. 4, during a time frame between t=t0 and t=t1, the temperature of the active die will rise quickly whereas the temperature of the flange will remain substantially constant as the thermal energy delivered by the active die during this time frame is insufficient to significantly heat up the flange, which has a much higher heat capacitance than the active semiconductor die.

Due to the increase in temperature of the active die, the thermal power delivered to the flange will also increase. At a given moment in time, the power dissipated in the active die will be substantially equal to the thermal power that is transported away from the active die. This latter thermal power substantially equals the thermal power delivered to the flange. When this balanced situation occurs, the temperature of the active die will no longer increase as rapidly as before. This situation is marked as t=t1 in FIG. 4.

The thermal power delivered to the flange will result in an increase in flange temperature. Because the flange is also cooled, a thermal equilibrium will also be reached here, albeit after a longer period of time. FIG. 4 marks this equilibrium as being reached at t=t2. In the period between t1 and t2, the flange temperature will slightly increase. This increase will result in a corresponding increase in active die temperature.

At t=t3, the dissipated power suddenly decreases. This will cause a sharp decrease in die temperature between t3 and t4, whereas the flange temperature does not change significantly in this time frame. At t=t5, both the flange and the die have reached a stable temperature.

The thermal behaviour of the active die will show a similar behaviour regardless the temperature of the flange. Moreover, the end temperature at t=t2 or at t=t5 can be correlated to the power dissipated in the active die. For a given application, a calibration can be performed for determining the correlation between the end temperatures and the dissipated power. This correlation can also take into account differences in flange starting temperatures. For example, when the RF amplifier system is operating in relatively hot environment, such as an oven, the increase in flange temperature will be noticeable in the end temperature of the active die.

The end temperature can be determined by waiting until a stable temperature has been reached. For some applications, this period may be too long.

To more quickly response to sudden increases in dissipated powers, it is advantageous to not only measure a single temperature after a predetermined amount of time, but to record a plurality of temperature values, in particular temperatures in the time period between t=t0 and t=t1. These values can be used in a curve fitting process wherein the thermal behaviour of the active die as a function of time is modelled by a mathematical curve. Here, the starting temperature of the flange can be taken as an input parameter or can be computed as a result of the curve fitting process. Alternatively or additionally, time-derivatives of the temperature can be calculated using the measured temperatures. These derivatives can be used, in combination with the measured temperatures, to estimate the end temperature of the active die and/or to estimate the power dissipated in the active die.

To correlate the various measured temperatures and the end temperature and/or dissipated power, a look-up table may be constructed. To construct this look-up table, the RF power amplifier may be operated under DC conditions only. During these conditions, the dissipated power can be computed by the product of bias current and bias voltage. Hence, the thermal response to a sudden increase in dissipated power can be determined, in terms of measured temperatures and/or derivatives thereof. For example, the temperature at t=t1 and t=t2 can be measured for a given dissipated power and for a given starting flange temperature. If needed, more temperature points can be measured at predefined time points after t=t0. This process can be repeated for different starting flange temperatures, for example by performing these measurements in an oven or other means wherein an ambient temperature can be set.

As stated above, the end temperature will generally depend on the flange temperature prior to the sudden increase in dissipated power. The RF power amplifier system may comprise a temperature sensor or other means to determine this temperature. However, it may also be possible to determine this temperature indirectly. This latter approach is based on the fact that in the absence of DC power and RF power supplied to the RF power transistor, other than the DC power required for operating the thermal unit if required, the dissipated power in the active die will be substantially zero. As a result, the temperature of the active die will be substantially determined by the temperature of the flange. Hence, by measuring the temperature under these circumstances, a baseline value of the flange temperature can be determined.

The present invention is particularly well suited to detect sudden changes in dissipated power. Prior to such change, the baseline temperature of the flange will be substantially constant and can easily be determined as described above. It is therefore advantageous if the operation of the RF power amplifier can be stopped in order to perform the temperature measurement of the flange. In some applications, such as solid state cooking, the amplifier can be operated intermittently. In between the periods in which the amplifier is amplifying signals, the flange temperature can be determined.

Although the present invention has been described using detailed embodiments thereof, the skilled person will appreciate that the invention is not limited thereto but that the scope of protection is determined by the appended claims and their equivalents. For example, the RF power amplifier system can be employed in numerous applications such as solid state cooking, plasma generators, cyclotrons, accelerators, RF heating, mobile base stations, broadcast stations, and MRI scanners.

The invention claimed is:

1. An RF power amplifier system for amplifying a first RF signal, comprising:
    an RF power amplifier being configured to amplify a second RF signal; and
    a control loop for controlling a power level of the second RF signal, comprising:
        a RF output power determining unit for determining a power level of the amplified second RF signal, wherein the RF output power determining unit comprises:
            a detecting system for detecting a DC power supplied to the RF power amplifier and for estimating a power dissipated by the RF power amplifier, wherein the detecting system comprises a thermal unit for determining a temperature of the RF power amplifier and a dissipated power estimating unit for estimating the dissipated power based on the determined temperature of the RF power amplifier; and
            a power estimating unit for estimating the power level of the amplified second RF signal based on the detected DC power and the estimated dissipated power;
        a gain determining unit for determining an actual large signal gain based on the determined power level of the amplified second RF signal and a power level of the second RF signal; and
        an attenuator for attenuating the first RF signal based on a difference between the determined actual large signal gain and a desired large signal gain and for providing the attenuated first RF signal to the RF power amplifier as the second RF signal.

2. The RF power amplifier system according to claim 1, wherein the power estimating unit is configured for estimating the power level of the amplified second RF signal based on the detected DC power, the estimated dissipated power, and a power level of the second RF signal.

3. The RF power amplifier system according to claim 1, wherein the detecting system comprises:
    a DC current detector for detecting a DC current supplied to the RF power amplifier; and
    a DC power determining unit for determining the DC power based on the detected DC current and a supply voltage applied to the RF power amplifier.

4. The RF power amplifier system according to claim 1, wherein the dissipated power estimating unit is configured to estimate the dissipated power based on a current determined temperature of the RF power amplifier, one or more previously determined temperatures of the RF power amplifier, or a time-derivative of the determined temperature.

5. The RF power amplifier according to claim 4, wherein the thermal unit comprises a temperature-sensitive component having voltage-current characteristics that are temperature-dependent.

6. The RF power amplifier system according to claim 5, wherein the RF power amplifier comprises an RF power transistor arranged on a semiconductor die, wherein the temperature-sensitive component is arranged on the semiconductor die, and wherein the temperature-sensitive component comprises a diode or a transistor.

7. The RF power amplifier system according to claim 6, wherein the RF power amplifier comprises a packaged RF power transistor, wherein the packaged RF power transistor comprises a package provided with a flange, and wherein the RF power transistor is mounted on said flange inside the package.

8. The RF power amplifier system according to claim 7, wherein:
    the thermal unit is further configured to determine the temperature of the flange; or
    the RF power amplifier system comprises a further thermal unit for determining a temperature of the flange, and
    wherein the dissipated power estimating unit is configured to estimate the dissipated power based on the determined flange temperature.

9. The RF power amplifier system according to claim 1, wherein the gain determining unit is further configured to determine a desired large signal gain based on a power level of the second RF signal.

10. The RF power amplifier system according to claim 1, wherein the attenuator is configured to increase an attenuation of the attenuator when the actual large signal gain is smaller than the desired large signal gain minus a first threshold.

11. The RF power amplifier system according to claim 10, wherein the attenuator is configured to decrease an attenuation of the attenuator when the actual large signal gain is larger than the desired large signal gain plus a second threshold.

12. The RF power amplifier system according to claim 1, further comprising an RF input power determining unit for determining the power level of the second RF signal.

13. The RF power amplifier system according to claim 12, wherein the RF input power determining unit comprises a directional coupler, a pin-diode, or a voltage or current sensor in combination with a look-up table.

14. A device comprising the RF power amplifier system according to claim 1, wherein the device is a telecommunications base state or a solid state cooking apparatus.

15. A method for amplifying a first RF signal using the RF power amplifier system according to claim 8, comprising:
    performing a calibration step in an absence of the second RF signal and substantial DC power being supplied to the RF power amplifier, wherein the calibration step comprises determining a flange temperature;
    applying the second RF signal and DC power to the RF power amplifier to amplify the second RF signal;
    estimating the power dissipated by the RF power amplifier based on the determined flange temperature, a current determined temperature of the RF power amplifier, and one or more previously determined temperatures of the RF power amplifier or a time-derivative of the determined temperature;
    determining the DC power supplied to the RF power amplifier;
    estimating the power level of the amplified second RF signal based on the detected DC power and the estimated dissipated power;

determining an actual large signal gain of the RF power amplifier based on the estimated power level of the amplified second RF signal and a power level of the second RF signal;
comparing the determined actual large signal gain to a desired large signal gain; and
controlling the attenuator based on the comparison.

* * * * *